(12) United States Patent
Hong et al.

(10) Patent No.: US 9,589,863 B2
(45) Date of Patent: Mar. 7, 2017

(54) POWER MODULE AND THERMAL INTERFACE STRUCTURE THEREOF

(71) Applicant: DELTA ELECTRONICS, INC., Taoyuan (CN)

(72) Inventors: Shouyu Hong, Taoyuan (CN); Yanlin Chen, Taoyuan (CN); Zhenqing Zhao, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 15/094,038

(22) Filed: Apr. 8, 2016

(65) Prior Publication Data

US 2016/0300777 A1 Oct. 13, 2016

(30) Foreign Application Priority Data

Apr. 10, 2015 (CN) .......................... 2015 1 0168819

(51) Int. Cl.
*H01L 23/36* (2006.01)
*H01L 23/373* (2006.01)

(52) U.S. Cl.
CPC ...... *H01L 23/3733* (2013.01); *H01L 23/3737* (2013.01)

(58) Field of Classification Search
CPC . H01L 2924/15311; H01L 2924/01079; H01L 23/36; H01L 23/3672; H01L 23/37; H01L 23/373
USPC ........................................... 257/713
See application file for complete search history.

(56) References Cited

U.S. PATENT DOCUMENTS

2005/0045855 A1* 3/2005 Tonapi .................... C09K 5/14
 252/500
2011/0038124 A1* 2/2011 Burnham ................ C08L 63/00
 361/717

FOREIGN PATENT DOCUMENTS

| CN | 102917574 A | 2/2013 |
| TW | 201242505 A | 10/2012 |
| TW | 201428057 A | 7/2014 |

* cited by examiner

*Primary Examiner* — Monica D Harrison
(74) *Attorney, Agent, or Firm* — Yunling Ren

(57) ABSTRACT

A power module and a thermal interface structure are provided herein. The thermal interface structure includes: a base and a plurality of filler particles distributed in the base. When the filler particles are under pressure, at least a part of the filler particles are deformed, and at least two adjacent filler particles partially contact with each other to form a heat-conducting path for transferring heat.

16 Claims, 11 Drawing Sheets

POWER MODULE AND THERMAL INTERFACE STRUCTURE THEREOF

This application is based upon and claims priority to Chinese Patent Application No. 201510168819.3, filed on Apr. 10, 2015, the entire contents of which are incorporated herein by reference.

TECHNICAL FIELD

The present disclosure relates to a thermal interface structure, and more particularly, to a thermal interface structure for a power module.

BACKGROUND

High efficiency, high power density and high reliability have always been the industry's requirements for power converters. High efficiency means less energy consumption, which helps to save energy, protect environment and reduce operation cost. High power density stands for small size, lightweight and less space requirement, thereby reducing construction cost. High reliability means longer service life and lower maintenance cost.

High efficiency, high power density and high reliability are closely related with excellent thermal management. Firstly, at a lower operating temperature, conduction losses of power devices such as MOSFET and IGBT may be reduced, which is beneficial to improve system efficiency. Secondly, on many occasions heat density directly determines power density. The power converter is a system for processing power conversion. Generally speaking, semiconductor devices generate high heat losses, but tolerable temperatures of the semiconductor devices are limited. And the semiconductor devices may be disabled or deteriorated sharply in performance in case of beyond the tolerable temperatures. Therefore, to control the temperature of a semiconductor chip within an acceptable range, a high-efficiency heat dispassion system is of vital importance. Thirdly, the lifespan of the semiconductor device is closely linked with temperature. Lower operating temperature may prolong the service life of the semiconductor device. An engineering experience exists in the electronic field: the lifespan of the semiconductor device may be shortened by half whenever temperature rises by 10 degrees. It can be known that a good thermal management is of vital importance for improving the conversion efficiency, power density and reliability of the power device.

SUMMARY

The present disclosure provides a thermal interface structure, which includes: a base; and a plurality of filler particles distributed in the base. When the filler particles are under pressure, at least a part of the filler particles are deformed, and at least two adjacent filler particles partially contact with each other to form a heat-conducting path for transferring heat.

The present disclosure also provides a power module, which includes at least a power component, a heat sink and the foregoing thermal interface structure, the thermal interface structure is disposed between the power component and the heat sink to form a heat-conducting path, and heat generated by the power component is transferred via the heat-conducting path to the heat sink.

DETAILED DESCRIPTION

Figure 1:
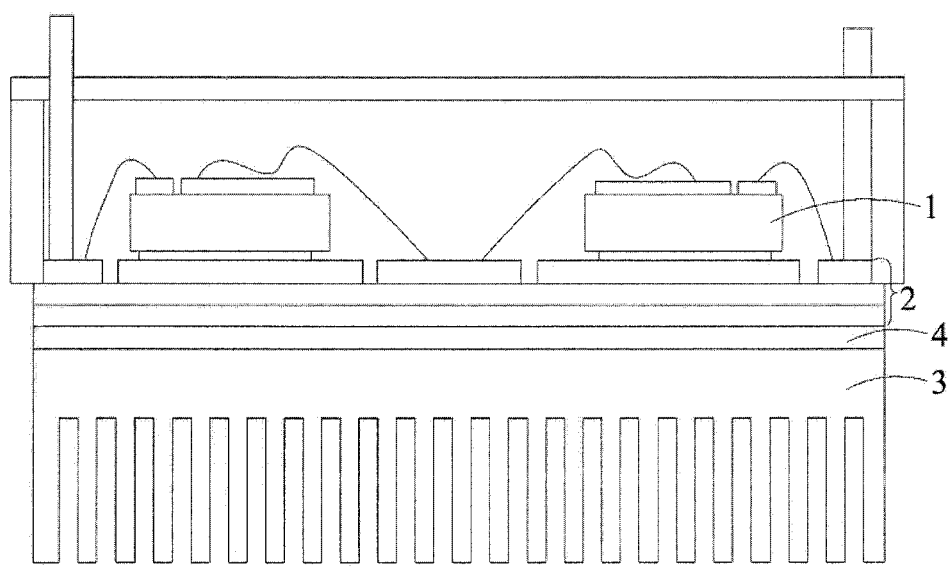
FIG. 1 is a schematic diagram of the conventional power module.

FIG. 1 is a schematic diagram of a conventional power module. As shown in FIG. 1, the power module includes a power device 1, a substrate 2, a heat sink (or a radiator) 3, and a thermal interface structure 4. The substrate 2 is a direct bonded copper (DBC) substrate, which is made from a copper layer, a ceramic layer and another copper layer. The power device such as a power semiconductor chip 1 is mounted on a wiring layer (soldering pad) of a DCB substrate 2 by die bonding material. And electric, mechanical and thermal connections between the power device and the DCB trace are achieved by means of the die bonding material. The top-side electrodes of the power semiconductor chip 1 are connected to the substrate by means of bonding wire or the like, and the electrodes connected with the system are pinned out by terminals. The top side of the power semiconductor chip 1 is subject to mechanical, environmental and electrical protection by the protective gel. Another side of the DCB substrate 2 is disposed on the heat sink 3. In order to ensure an excellent heat conduction path, a thermal interface structure 4 generally is disposed between the substrate 2 and the heat sink 3, for example, heat-conducting silicone grease. The heat-conducting silicone grease can be effectively filled in gaps between the power module and the heat sink, thus realizing a better heat conduction effect than air.

Taking a typical stacked structure as an example, during the process of transferring heat of the chip 1 to the heat sink 3, two bottlenecks exist. The ceramic layer of DCB substrate, the aluminum oxide ceramic with a thickness of 0.63 mm and a thermal conductivity of about 20 W/m.K, has a thermal resistance of 31.5 K/W per square millimeter. And the thermal interface structure, the heat-conducting silicone grease with the thickness of 0.1 mm and the thermal conductivity of 1 W/m.K, has a thermal resistance of 100 K/W per square millimeter. Thus it can be seen that the thermal interface structure (for example, heat-conducting silicone grease) is one of key factors to influence the heat dissipation performance of the power module. A thermal interface structure having excellent performance plays an important role in improving heat dissipation of the power module.

Figure 2:
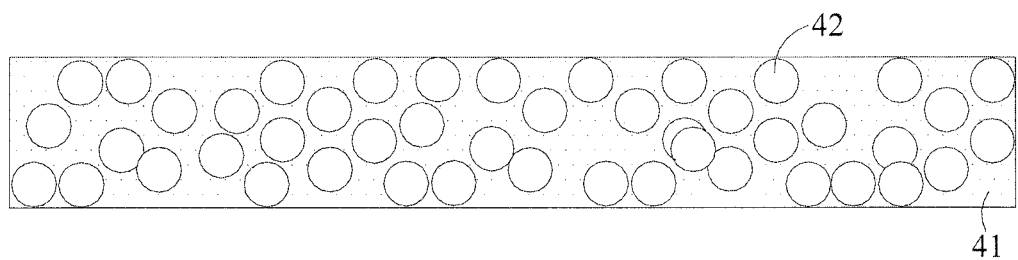
FIG. 2 is a schematic diagram of the conventional thermal interface structure.

FIG. 2 shows a schematic diagram of a main body structure of a conventional thermal interface structure. The thermal interface structure mainly includes a base material and high thermal conductive fillers. The base material 41 may be silicone, epoxy, acrylic acid or other materials. The base material 41 has following main functions: 1) filling tiny spaces among the rough surfaces of the top side of the heat sink or the back side of the power device; 2) facilitating workability; and 3) filling gaps among the high thermal conductive fillers. The high thermal conductive fillers 42 are solid non-deformable particles, such as high thermal conductive ceramic particles. The high thermal conductive filler can increase thermal conductivity of material. Generally, the higher the content of the high thermal conductive filler is, the higher the thermal conductivity of material is. Therefore, the thermal conductivity of the thermal interface structure can be increased by raising the content of the high thermal conductive filler. However, as the content of the high thermal conductive filter increases, viscosity of the thermal interface structure may be increased. As a result, the workability of the thermal interface structure and the performance of gap filling will be reduced. Therefore, there are contradictions among the thermal conductivity, gap filling ability, and the workability which are difficult to reconcile. It is a technical problem to be solved urgently how to improve the thermal conductivity of the thermal interface structure under the premise of not influencing the viscosity and workability.

Exemplary embodiments will be described more comprehensively by referring to accompanying drawings. However, exemplary embodiments can be implemented in many forms. It shall be understood that the present disclosure is not limited to embodiments as set forth herein. Instead, these embodiments are provided to ensure the present disclosure to be more comprehensive and complete. And the conception of these exemplary embodiments shall be fully conveyed to those skilled in the art. In drawings, thickness of areas and layers may be exaggerated for clarity. The same numbers in drawings represent the same or similar structures, and thus detailed description thereof will be omitted.

In addition, characteristics, structures or features as described may be incorporated into one or more embodiments in any right way. Many concrete details are provided in the following descriptions for a full understanding of embodiments of the present disclosure. However, those skilled in the art will realize that the technical solution of the present disclosure may be practiced without one or even more the specific details, or other methods, components, materials and the like may be used. In other circumstances, known structures, materials or operations are not shown or described in detail for the avoidance of fuzziness of the main technological creativity of the present disclosure.

First of all, a typical heat-conducting path of the thermal interface structure is described.

Figure 3A:
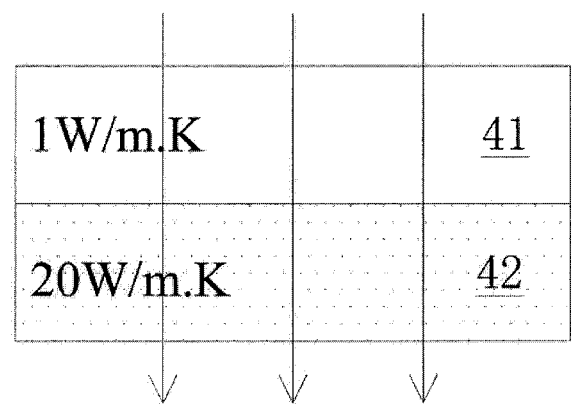
FIGS. 3a and 3b are schematic diagrams respectively showing the thermal interface structure having different positional relationships.
Figure 3B:
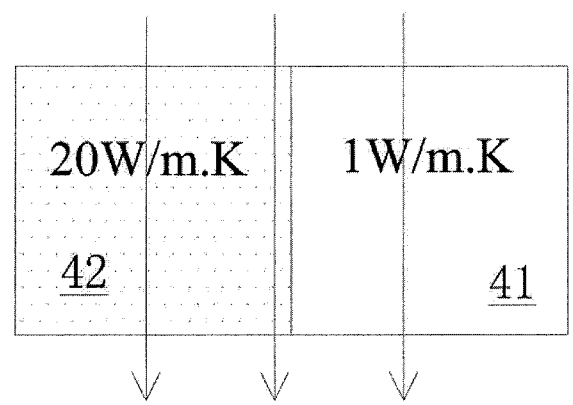

As mentioned above, a typical thermal interface structure mainly includes two types of materials: the base material and the high thermal conductive fillers. The thermal conductivity of the base material generally ranges from 0.1 W/m.K to 1 W/m.K, while the thermal conductivity of the high thermal conductive filler generally ranges from 5 W/m.K to 400 W/m.K. And generally the high thermal conductive filler is distributed in the base material. In order to explain the relation between the thermal conductivity of the high thermal conductive filler and a transfer path, FIGS. 3a and 3b respectively show the thermal interface structure in which the base material and the high thermal conductive filler are in two positional relationships, both of which are hypothetical structures merely for a schematic illustration. In the figures, it is assumed that the base material 41 has a thermal conductivity of 1 W/m.K, and the high thermal conductive filler 42 has a thermal conductivity of 20 W/m.K. In FIG. 3a, the base material 41 and the high thermal conductive filler 42 are arranged in stack. In FIG. 3b, the base material 41 and the high thermal conductive filler 42 are arranged side by side. The direction as directed by arrows in the figures is a heat transfer direction. The thermal interface structure arranged in the manner as shown in FIG. 3a has an equivalent thermal conductivity of 1.9 W/m.K, and the thermal interface structure arranged in the manner as shown in FIG. 3b has an equivalent thermal conductivity of 10.5 W/m.K. With respect to the thermal interface structure, besides increasing the content of the high thermal conductive filler, it is also a very effective way to establish a contact path for the high thermal conductive filler along the heat transfer direction.

A thermal interface structure is provided, which is improved in terms of the transfer path to reduce the thermal resistance of the thermal interface structure.

Figure 4:
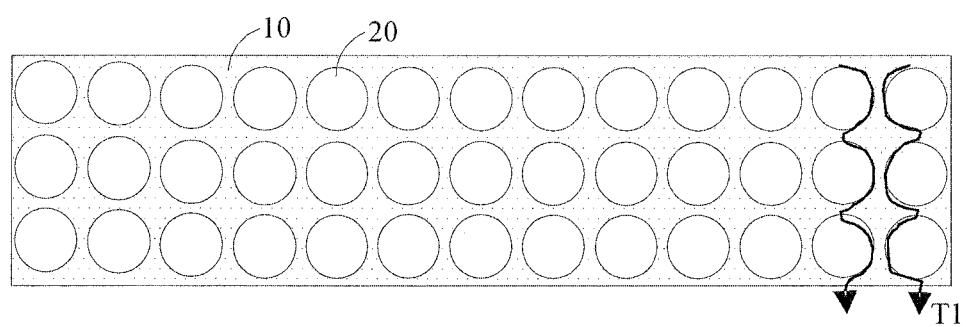
FIG. 4 is a schematic diagram of the thermal interface structure according to the first embodiment of the present disclosure, wherein the filler particles are undeformed.
Figure 5:
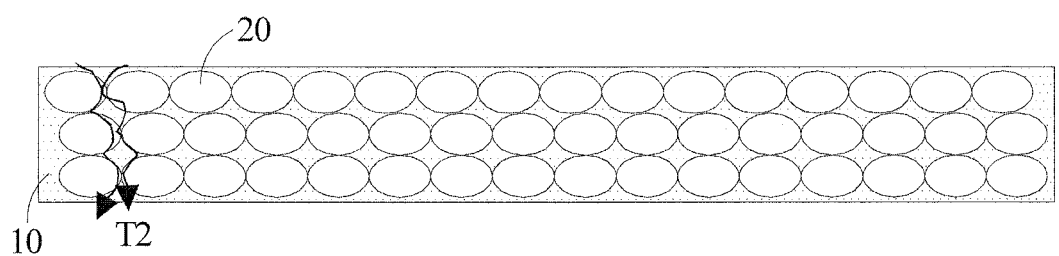
FIG. 5 is a schematic diagram of the thermal interface structure according to the first embodiment of the present disclosure, wherein the filler particles are deformed.

Referring to FIGS. 4 and 5, the present embodiment provides a thermal interface structure, which may be applied to a power module having power components and heat sinks. The thermal interface structure is disposed between the power component and the heat sink so that heat generated by the power component is transferred via the thermal interface structure to the heat sink.

The thermal interface structure includes a base 10 and a plurality of filler particles 20 distributed in the base 10. When the filler particles are under pressure, a part of the filler particles 20 or all of the filler particles 20 are deformed. And at least two adjacent filler particles 20 partially contact with each other to form the heat-conducting path for transferring heat, so that heat generated by the power component is transferred via the heat-conducting path to the heat sink. Herein deformation of the filler particles 20 may be realized by many means, for example, the filler particles 20 are deformed by external force applied thereupon during the mounting. When the base material itself cannot be cured, the pressure shall be always maintained. When the base material itself can be cured, the pressure shall be necessarily maintained during the mounting, and may be removed after the base material is cured. The pressure provided by the base itself may maintain the deformation of the filler particles 20.

FIG. 4 illustrates a status of the filler particles undeformed, the undeformed filler particles are round, and the adjacent filler particles 20 have a minimum contact area. When the thermal interface structure is disposed on the lower surface of the power component, heat produced by the power component is transferred from the upper surface of the thermal interface structure to the lower surface thereof, and the transfer path is T1 (it is noted that T1 is merely indicated on the surface of the filler for the convenience of description, actually a heat transfer path also exists inside the filler). It is thus clear that along the transfer path T1, the filler particles have a minimum contact area and the thermal interface structure has a large thermal-conduction resistance, which is disadvantageous to effective transfer of heat. FIG. 5 shows that the filler particles are in the state of deformation, heat produced by the power component is transferred from the upper surface of the thermal interface structure to the lower surface thereof, and the transfer path is T2 (it is noted that T2 is merely indicated on the surface of the filler for the convenience of description, actually a heat transfer path also exists inside the filler). It is thus clear that along the transfer path T2, the contact area of the deformed filler particles under pressure is increased so that the thermal-conduction resistance of the thermal interface structure is significantly reduced and heat can be effectively and sufficiently transferred to the outside, for example, transferred to the beneath heat sink, which is advantageous to quickly heat dissipation.

Therefore, by adopting filler particles having deformation ability, the thermal interface structure of the present disclosure may establish a complete contact among its high thermal conductive filler particles under the action of pressure, so that the contact area of adjacent filler particles is increased. As a result, the thermal conductivity of the thermal interface structure can be increased, and a heat-conducting path can be formed for transferring heat quickly and effectively. Compared with the conventional thermal interface structure in which filler particles are unable to be deformed, the present disclosure may improve the thermal conductivity of material under the same content of high thermal conductive fillers, or reduce the content of high thermal conductive fillers to increase the workability and improve the capacity of the thermal interface structure in eliminating tiny gaps among surface roughness under the same thermal conductivity of materials. Therefore, the present disclosure breaks the traditional idea that the thermal resistance shall be reduced by increasing the content of the filler particles, and achieves a balance among the thermal conductivity, gap filling ability, and the workability.

Figure 6:
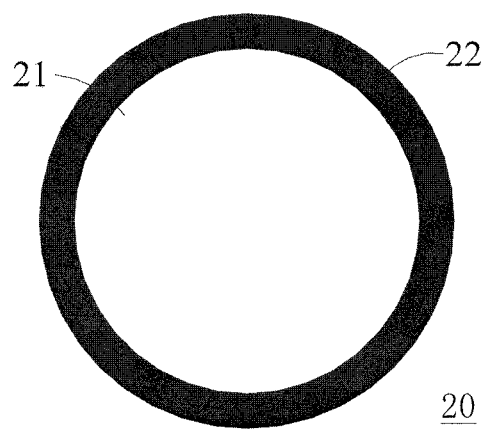
FIG. 6 is a schematic diagram of the filler particles of the thermal interface structure according to the first embodiment of the present disclosure.

In the present embodiment, as shown in FIG. 6, each of the filler particles 20 includes a first filler part 21 and a second filler part 22. The first filler part 21 is made of deformable material. And the second filler part 22 is made of heat conducting material and wraps around the first filler part 21. The first filler part 21 may be made of materials having lower elastic modulus such as air or organic material particles (for example, resin material). The second filler part 22 may be made of materials having relatively higher elastic modulus, for example, metal materials such as copper, aluminum, silver or alloy thereof, etc. The elastic modulus of the first filler part 21 is lower than one fifth of that of the second filler part 22 to guarantee sufficient deformation ability and ensure that a contact path (i.e., a heat-conducting path) with a larger area is formed between two adjacent filler particles. The thermal conductivity of the second filler part 22 may be more than twice that of the first filler part 21.

In an embodiment, an organic material particle having a thermal conductivity of 0.1 W/m.K to 1 W/m.K and a diameter of 4 µm to 50 µm may be selected and used as a core of the filler particles. And a metal layer (for example, copper, silver, nickel or gold and the like, or a composite layer such as nickel/gold or copper/silver and the like) having a thickness of 1 µm to 100 µm is formed on the organic material particle by means of a chemical process and so on. The thermal conductivity of the metal layer is more than twice that of the organic material particle, for example, the thermal conductivity of the metal layer generally may be ranged from 5 W/m.K to 400 W/m.K. The filler particles are formed in this way, and are dispersedly distributed in the base 10 with a weight ratio of 70%-95%, to form the thermal interface structure having a high thermal conductivity.

As shown in FIG. 6, in the present embodiment, the second filler part 22 completely wraps around the outside surface of the first filler part 21. For example, the second filler part 22 is formed in a foaming manner and completely wraps around the first filler part 21, while the first filler part 21 is air.

It should be noted that pressure as referred to in the present disclosure may be pressure applied to the thermal interface structure when it is mounted or pressure applied to the thermal interface structure when it is cured and shaped. Specifically, when the base material cannot be cured, the filler particles are in a free state (a state under no pressure) after the thermal interface structure is dispensed, as shown in FIG. 4. Therefore, when the thermal interface structure is mounted, the thermal interface structure is compressed between the power component and the heat sink by the external force which is maintained so that the first filler part is always in a state of deformation. When the base material is curable, pressure is applied to the filler particles distributed inside the base during the curing process so that the filler particles may be deformed. The pressure can be removed after the base material is cured, and the filler particles may still be in a deformation state.

The present embodiment is described by taking an example in which the filler particles have two layers of an inner layer and an outer layer. Actually, the filler particles may have a structure with three layers or more than three layers. For example, the filler particles may also include a third filler part (not shown), which is disposed at the outer surface of the second filler part. The third filler part may have thermal conductivity and insulativity. In the three-layered filler particles, the inner layer may be material having lower elastic modulus, for example, air or the like; the intermediate layer may be high thermal conductive material such as aluminium, copper, silver or the like, which is a major thermal conductive layer; and the outer layer may be material such as aluminium oxide or copper oxide or the like, which generally has a thickness lower one fifth of that of the intermediate layer. Meanwhile the outer layer has a certain thermal conductivity, thus it has relatively small influence on heat conduction. Such structure has the advantage that coatings having certain insulation performance may be additionally provided around the periphery of the metal layer so that the filler particles have certain insulating capability.

Figure 7:
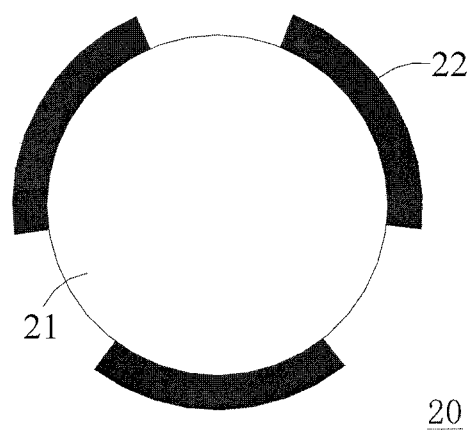
FIG. 7 is a schematic diagram of the filler particles of the thermal interface structure according to the second embodiment of the present disclosure.

Referring to FIG. 7, the difference between the filler particles of the thermal interface structure in FIG. 7 and those in FIG. 6 resides in that the second filler part 22 partially wraps around the outer surface of the first filler part 21, and the second filler part 22 may be a plurality of metal particles formed around the outside surface of the first filler part 21 by way of plating. Other parts of FIG. 7 are approximately the same as FIG. 6, and thus their detailed descriptions are omitted herein.

It is to be understood that the formation and manufacturing process of the filler particles are not limited to what is mentioned herein, and any structure available for deformation of the filler particles may be within the scope of protection of the present disclosure.

Figure 8:
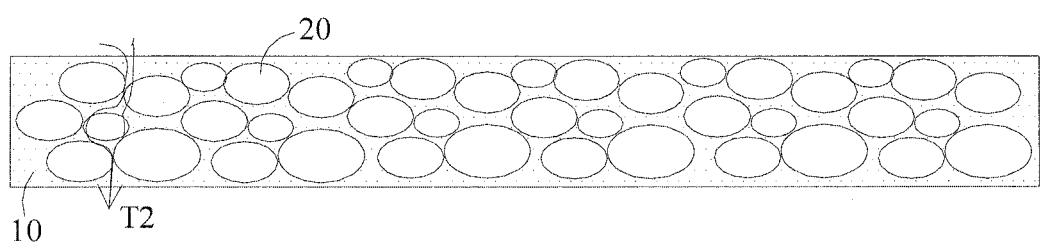
FIG. 8 is a schematic diagram of the thermal interface structure according to the third embodiment of the present disclosure.

Referring to FIG. 8, the difference between the thermal interface structure in FIG. 8 and that in FIG. 5 resides in that at least two of the filler particles have different outer diameters, and filler particles with smaller outer diameters are filled among filler particles with larger outer diameters.

In the present embodiment, the particle diameter of the filler may be distributed optimally. When the filler particles with different particle diameters are adopted, filler particles with smaller particle diameters may be filled in gaps among filler particles with larger particle diameters, thus playing a role in increasing a volume content of high thermal conductive material and increasing contact paths thereof. Other parts of FIG. 8 are approximately the same as FIG. 5, and thus their detailed descriptions are omitted herein.

Figure 9:
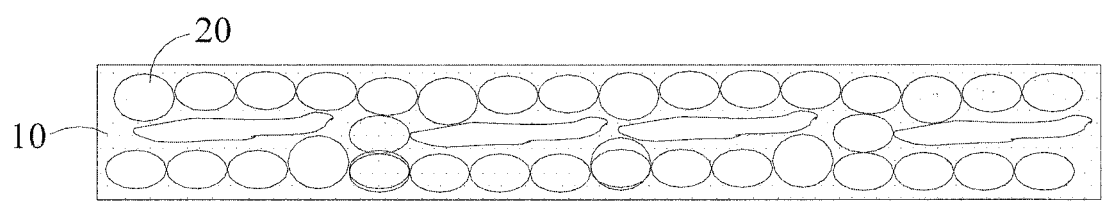
FIG. 9 is a schematic diagram of the thermal interface structure according to the fourth embodiment of the present disclosure.

Referring to FIG. 9, the difference between the thermal interface structure in FIG. 9 and that in FIG. 5 resides in that shapes of the filler particles exhibit a great variety of shapes, such as a spherical shape, an ellipsoidal shape, a prismatic shape with regular or irregular polygon cross section, cylindrical shapes with different heights and diameters, a flake shape, a tapered shape or the like and the combinations thereof. Flake-shaped filler particles are disposed among spherical and ellipsoidal filler particles to raise the area of the contact path thereof. Other parts of FIG. 9 are approximately the same as FIG. 5, and thus their detailed descriptions are omitted herein.

Figure 10:
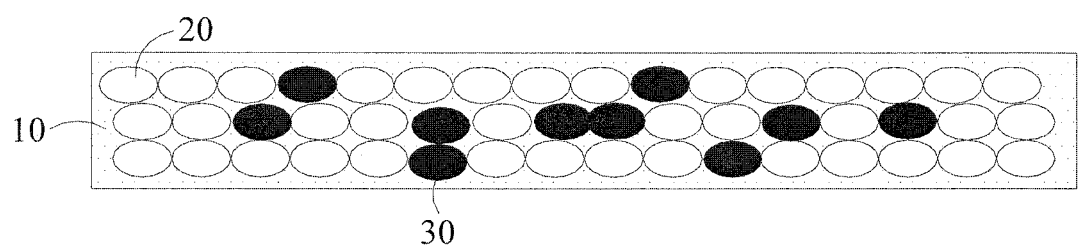
FIG. 10 is a schematic diagram of the thermal interface structure according to the fifth embodiment of the present disclosure.

Referring to FIG. 10, the difference between the thermal interface structure in FIG. 10 and that in FIG. 5 resides in that the thermal interface structure includes non-deformable auxiliary filler particles 30. The non-deformable auxiliary filler particles 30 are made of heat conducting material, and both the auxiliary filler particles 30 and the filler particles 20 are distributed in the base 10. The filler particles 20 can be any form as recited in the foregoing embodiments, and the auxiliary filler particles 30 are conventional fillers, for example, solid metal particles, solid ceramic particles or the like. The non-deformable auxiliary filler particles contact with the deformable filler particles to increase the thermal conductivity of the thermal interface structure.

In addition, the auxiliary filler particles may be polygonal, the filler particles can be spherical and ellipsoidal, and the auxiliary filler particles are adjacent to the filler particles, thus increasing the area of the contact path thereof. Other parts of FIG. 10 are approximately the same as FIG. 5, and thus their detailed descriptions are omitted herein.

In conclusion, Because of filler particles with deformation ability, high thermal conductive filler particles will establish sufficient contact under the action of pressure so that the contact area of adjacent filler particles is increased. As a result, the thermal conductivity of the thermal interface structure in the present disclosure is increased and the heat-conducting path for transferring heat quickly and effectively is formed. Compared with the conventional thermal interface structure in which filler particles are unable to be deformed, the present disclosure may improve the thermal conductivity of material under the same content of high thermal conductive fillers. Or the present disclosure can reduce the content of high thermal conductive fillers to increase workability and improve a capability of the thermal interface structure in eliminating tiny gaps among surface roughness, under the same thermal conductivity of materials. Therefore, the present disclosure breaks a traditional idea that the thermal resistance shall be reduced by increasing the content of the filler particles, and achieves a balance between the thermal conductivity, gap filling ability, and the workability.

Although description of the present disclosure is made in reference to a plurality of typical embodiments, it shall be understood that terms used herein are exemplary and explanatory only and are not restrictive. The present disclosure can be concretely implemented in various forms without departing from spirit or substance of the present disclosure. Therefore, it shall be understood that above embodiments are not limited to any foregoing detail, but shall be extensively interpreted within the spirit and scope as defined in appended claims. Thus, all variations and modifications falling within claims or equivalent scope thereof shall be covered with appended claims.

What is claimed is:

1. A thermal interface structure, comprising:
   a base; and
   a plurality of filler particles distributed in the base;
   wherein when the filler particles are under pressure, at least a part of the filler particles are deformed, and at least two adjacent filler particles partially contact with each other to form a heat-conducting path for transferring heat, and
   wherein each of the filler particles comprises a first filler part and a second filler part, the first filler part is made of deformable material, the second filler part is made of heat conducting material, and the second filler part partly or completely wraps around an outside surface of the first filler part.

2. The thermal interface structure of claim 1, wherein a thermal conductivity of the second filler part is more than twice that of the first filler part, and an elastic modulus of the first filler part is lower than one fifth of that of the second filler part.

3. The thermal interface structure according to claim 1, wherein material of the first filler part is air or organic material, and the second filler part is made of metallic material.

4. The thermal interface structure of claim 3, wherein the second filler part is formed in a foaming manner and completely wraps around the first filler part, and the first filler part is air.

5. The thermal interface structure according to claim 1, wherein the first filler part is an organic material particle, the second filler part is a metal layer, and the second filler part wraps around the first filler part.

6. The thermal interface structure of claim 5, wherein the filler particles are dispersedly distributed in the base with a weight ratio of 70%-95%.

7. The thermal interface structure of claim 5, wherein the second filler part is a plurality of metal particles formed around the outside surface of the first filler part by way of plating.

8. The thermal interface structure of claim 1, wherein the plurality of filler particles are distributed in the base which is cured and shaped, so that the first filler part is in a state of compressive deformation.

9. The thermal interface structure of claim 1, wherein each of the filler particles further comprises a third filler part disposed on an outside surface of the second filler part, and the third filler part is heat-conducting and insulating material.

10. The thermal interface structure of claim 9, wherein a thickness of the third filler part is less than or equal to one fifth of that of the second filler part.

11. The thermal interface structure of claim 1, wherein at least two of the filler particles have different outer diameters, and filler particles with smaller outer diameters are filled among filler particles with larger outer diameters.

12. The thermal interface structure of claim 1, wherein shapes of the filler particles comprise at least one of a spherical shape, an ellipsoidal shape, a cylindrical shape and a flake shape.

13. The thermal interface structure of claim 1, wherein the thermal interface structure further comprises nondeformable auxiliary filler particles made of heat conducting material, both the auxiliary filler particles and the filler particles are distributed in the base and a part of the auxiliary filler particles are in contact with a part of the filler particles.

14. The thermal interface structure of claim 13, wherein the auxiliary filler particles are solid metal particles or solid ceramic particles.

15. A power module, comprising at least a power component, a heat sink and a thermal interface structure, wherein the thermal interface structure is disposed between the power component and the heat sink to form a heat-conducting path, and heat generated by the power component is transferred via the heat-conducting path to the heat sink;
the thermal interface structure comprising:
a base; and
a plurality of filler particles distributed in the base;
wherein when the filler particles are under pressure, at least a part of the filler particles are deformed, and at least two adjacent filler particles partially contact with each other to form a heat-conducting path for transferring heat, and
wherein each of the filler particles comprises a first filler part and a second filler part, the first filler part is made of deformable material, the second filler part is made of heat conducting material, and the second filler part partly or completely wraps around an outside surface of the first filler part.

16. The power module of claim 15, wherein the thermal interface structure is compressed between the power component and the heat sink so that the first filler part is in a state of deformation.

* * * * *